Figure 7:
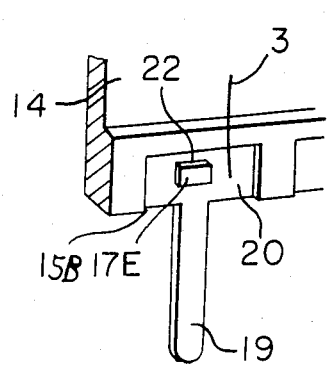
Figure 7:
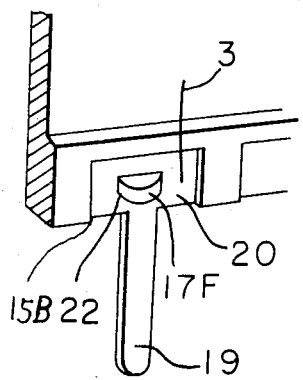

United States Patent [19]

Kambara et al.

[11] Patent Number: 4,516,090
[45] Date of Patent: May 7, 1985

[54] ULTRASONIC DELAY LINE

[75] Inventors: Toru Kambara; Michihiko Uemura; Takeya Iwanaga, all of Yokohama, Japan

[73] Assignee: Asahi Glass Company Ltd., Tokyo, Japan

[21] Appl. No.: 484,503

[22] Filed: Apr. 13, 1983

[30] Foreign Application Priority Data

Apr. 22, 1982 [JP] Japan ............................ 57-57630[U]
Apr. 22, 1982 [JP] Japan ............................ 57-57631[U]

[51] Int. Cl.³ ........................ H03H 9/10; H03H 9/25; H03H 9/36
[52] U.S. Cl. .................................... 333/141; 310/348; 333/149
[58] Field of Search ................ 333/141–155, 333/193–196; 310/311, 313 R, 313 A, 313 B, 313 C, 313 D, 340–346, 348–356; 174/50.5, 50.51, 50.52, 50.54, 51, 52, 50.56

[56] References Cited

U.S. PATENT DOCUMENTS 3,872,331  3/1975  Falco ........................... 333/150 X
4,291,285  9/1981  Kadota ........................... 333/150
4,314,215  2/1982  Tanji et al. ..................... 333/193

FOREIGN PATENT DOCUMENTS 55-36635  3/1980  Japan .

Primary Examiner—Marvin L. Nussbaum
Attorney, Agent, or Firm—Oblon, Fisher, Spivak, McClelland & Maier

[57] ABSTRACT

An ultrasonic delay line of a construction which is made up of: a casing having therein a delay medium accommodating section to accommodate therein a delay medium and a terminal accommodating section to accommodate therein planar metal terminals; and a cover to tightly close the casing, in which the terminal accommodating section has a plurality of projections to fix the planar metal terminals, a partition frame is provided between the terminal accommodating section and the delay medium accommodating section to separate both accommodating sections, the delay medium is accommodating in the delay medium accommodating section, the base part of the planar metal terminal is positioned and housed by means of projections in the terminal accommodating section, and one end of a lead wire, the other end of which has been connected with a transducer provided on the said surface of the delay medium, is connected with the base part of the planar metal terminal.

6 Claims, 15 Drawing Figures

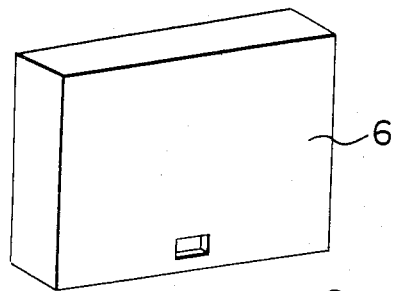
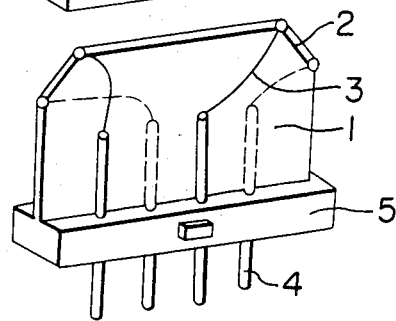
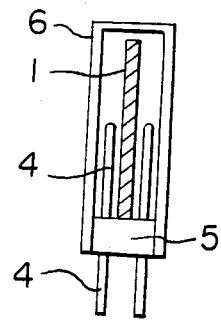
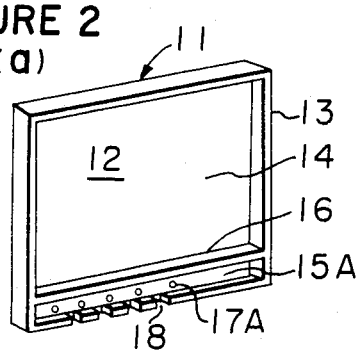
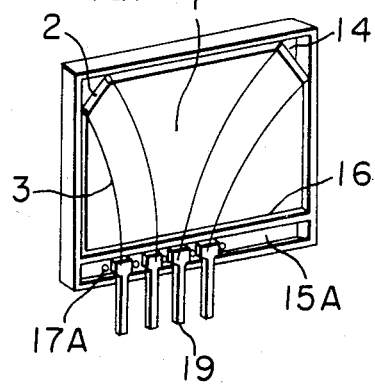
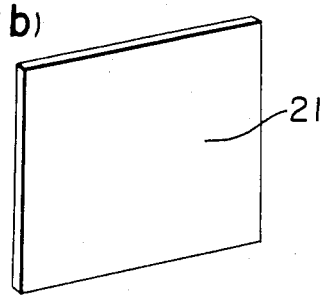
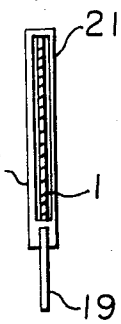

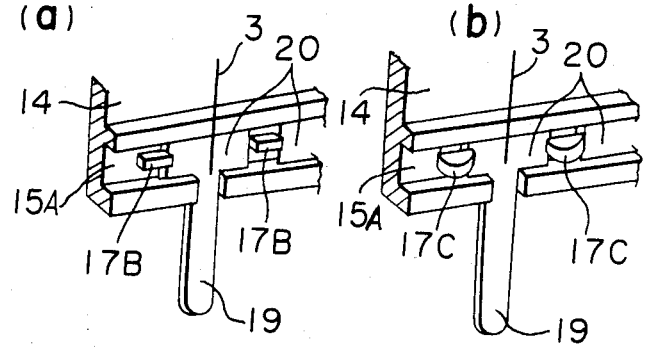
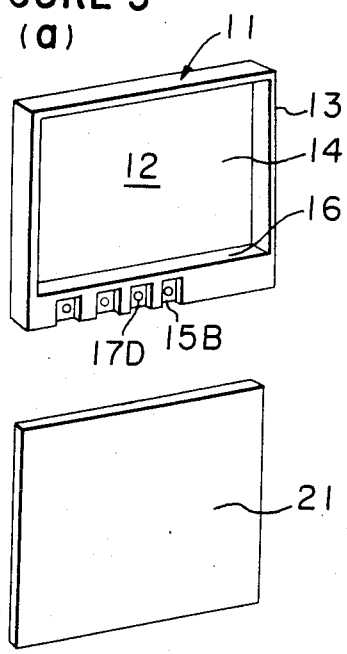
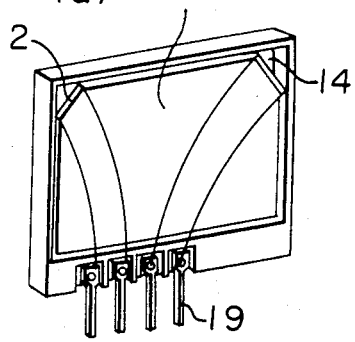
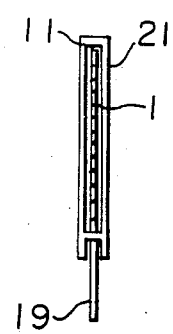

ULTRASONIC DELAY LINE

This invention relates to an ultrasonic delay line, and, more particularly, it is concerned with an ultrasonic delay line made of glass, in which input and output transducers are provided on a thin glass plate.

The ultrasonic delay line has recently been used in an increased amount in VTR, video-camera, and other video products, and, in connection with demands for size-reduction, weight-reduction, and so on in these video products, the ultrasonic delay line itself is desired to have its size and weight reduced.

One of the ways to solve such problem is to reduce the size of the delay medium. To attain the size-reduction, there may be contemplated such ways as slowing down the propagating speed of the ultrasonic wave, the number of reflections of the ultrasonic wave within the delay medium, and so forth. There is also a method of reducing the size of the ultrasonic delay line by improving a package, in which the delay medium is to be accommodated. The present invention is concerned with improvement in such package for accommodating the delay medium.

Conventionally, the ultrasonic delay line is constructed, as shown in FIG. 1(b) of the accompanying drawing, with a thin planar delay medium (1) made of glass, and input and output transducers (2) provided on the side wall of the delay medium. A lead wire (3) is connected at its one end with the transducer (2), and the other end of the lead wire is soldered to terminal pin (4). The delay medium (1) is mounted on a base plate (5), and fixedly supported from both surface of the delay medium by means of the terminal pins (4) which are arranged in a state of piercing through the base plate (5), and a box-shaped casing (6) with the bottom part thereof being open as shown in FIG. 1(a) encloses those portions such as the base plate, the delay medium, the lead wire, and the terminal pins which protrude upwardly from the base plate, as shown in FIG. 1(c), and fixedly covers the base plate, thereby forming an integral package structure.

In the above-described construction, the four terminal pins (4) and the delay medium (1) are accommodated or housed in the package in their state of being superposed each other at one portion thereof. On account of this, even if the delay medium is of a thin thickness, reduction in thickness and size of the entire device was difficult.

Further, there has also been proposed an ultrasonic delay line, in which the terminal pins are replaced by planar metal terminals, and these planar terminals are disposed at one surface side of the delay medium as disclosed, for example, in Japanese unexamined utility model publication No. 36635/1980, and others, with a view to further reducing thickness of the delay medium. However, while this type of the ultrasonic delay line has been made thinner than that shown in FIG. 1 which is provided with pins on both sides of the delay medium, its construction is such that the planar metal terminal is made of a resilient spring to press the delay medium. On account of this, reduction in thickness of the delaying medium is not sufficient, and, moreover, when the delay medium is to be soldered to the printed circuit board by use of a solder bath, flux of the solder tends to readily intrude into the delay medium accommodating section along the planar metal terminal to readily bring about troubles, which is the point of problem in this delay line.

It is therefore an object of the present invention to provide an ultrasonic delay line having high reliability and being small in size; in particular, an ultrasonic delay line with its thickness having been made thinner.

According to the present invention, in general aspect of it, there is provided an ultrasonic delay line, comprising: a casing having therein a delay medium accommodating section to accommodate therein a delay medium and a terminal accommodating section to accommodate therein planar metal terminals; and a cover to tightly close said casing, wherein said terminal accommodating section has a plurality of projections to fix the planar metal terminals, a partition frame is provided between said terminal accommodating section and said delay medium accommodating section to separate said both accommodating sections, the delay medium is accommodated in said delay medium accommodating section, the base part of said planar metal terminal is positioned and housed by means of said projections in said terminal accommodating section, and one end of a lead wire, the other end of which has been connected with a transducer provided on the side surface of the delay medium, is connected with the base part of said planar metal terminal.

The foregoing object, other objects, as well as specific construction and function of the ultrasonic delay line according to the present invention will become more apparent and understandable from the following detailed description of a few preferred embodiments thereof, when read in conjunction with the accompanying drawing.

In the drawing:

FIGS. 1(a), 1(b), and 1(c) are respectively perspective views and a cross-sectional view showing a conventional embodiment of the ultrasonic delay line;

FIGS. 2(a) and 2(b) are respectively perspective views showing a casing and a cover for use in the first embodiment of the present invention;

FIGS. 3(a) and 3(b) are repsectively a perspective view and a cross-sectional view showing a state, in which a delay medium has been housed in the casing shown in FIG. 2;

FIGS. 4(a) and 4(b) are respectively partial perspective view of other embodiment of a projection to be formed at the terminal accommodating section;

FIGS. 5(a) and 5(b) are respectively perspective views of the casing and the cover for use in the second embodiment according to the present invention;

FIGS. 6(a) and 6(b) are respectively a perspective view and a cross-sectional view showing a state, in which a delay medium has been accommodated in the casing shown in FIG. 5; and FIGS. 7(a) and 7(b) are partial perspective views of other embodiments of the projection to be formed at the terminal accommodating section.

In the following, the present invention will be described in detail with reference to a couple of preferred embodiments as shown in the accompanying drawing.

The package to be used for the ultrasonic delay line according to the present invention comprises two members, that is: the one is a casing to house in it a delay medium accommodating section which accommodates therein the delay medium, a terminal accommodating section which accommodates therein flat metal terminals and which has a plurality of projections to fixedly secure the flat metal terminals in it, and a partitioning frame formed between the terminal accommodating section and the delay medium accommodating section to partition both accommodating sections and to prevent the flux, and other foreign substances from intruding into the delay medium accommodating section; and the other is a cover which is to be assembled with the casing to tightly close the delay medium.

For the delay medium to be accommodated in this delay medium accommodating section, there may be used a solid ultrasonic delay medium in a polygonal shape such as a pentagonal, hexagonal, and others, in which the input and output transducers are provided on a thin plate of glass, ceramic, and like other materials. Depending on necessity, a acoustical absorbing material may be provided in dot or linear form on the principal surface or the reflecting surface of the solid ultrasonic delay medium. Cuts in the form of slits may also be formed for this purpose. Generally, any known delay medium can be used.

IN the following, explanations will be given as to the first embodiment of the present invention in reference to the accompanying drawing.

FIGS. 2(a) and 2(b) illustrate the casing (11) and the cover (21) for use in the present invention. The casing (11) comprises a bottom plate (12), an outer frame (13) enclosing the bottom plate (12), a delay medium accommodating section (14) having a large area and provided on the upper part of the casing (11), a terminal accommodating section (15A) having a small area and provided on the lower part of the casing (11), and a partitioning frame (16). A plurality of projections (17A) (five, in this embodiment) are provided on the bottom plate of the terminal accommodating section, and four notches (18) are formed in the outer frame at the lower part of the terminal accommodating section.

As shown in FIGS. 3(a) and 3(b), the delay medium (1) is housed in the delay medium accommodating section (14) of the casing, while planar metal terminals (19) of thin thickness are housed in the terminal accommodating section (15A) of the casing. As shown in FIG. 4(a), the base part (20) of the planar metal terminal (19) has a large width, which is secured by frictional force due to its insertion into a space between two adjacent projections in the terminal accommodating section. Further, where more strength is required, the distal ends of the projections are collapsed, as shown in FIG. 4(b), under compression by means of ultrasonic welding, and so forth to rigidly fix the base part of the terminal between the projections. To this base part (20) of the planar metal terminal, there is connected, by soldering or welding, one end of the lead wire (3), the other end of which has been connected to the transducer (2) by soldering or with an electrically conductive adhesive agent, or else.

Since the ultrasonic delay line in this embodiment is of such a construction as mentioned above, the delay medium (1) and the planar metal terminal (19) are not superposed, thereby making it possible to design the ultrasonic delay line with an extremely thin thickness, as shown in FIG. 3(b). In addition, since the terminal accommodating section (15A) is perfectly independent of the delay medium accommodating section (14), any foreign substance such as solder flux, etc. hardly intrudes into the delay medium accommodating section from outside, and also the planar metal terminal (19) can be readily inserted and fitted in the terminal accommodating section with the help of the projections (17A) formed in this terminal accommodating section (15A) followed by rigid fixing of the same.

In the embodiment shown in FIGS. 2 and 3, the projections in the terminal accommodating section are in cylindrical form, although any other forms may be adopted, provided that the planar metal terminal can be secured without failure. FIGS. 4(a) and 4(b) illustrate such embodiment.

In the embodiment shown in FIG. 4(a), the projection (17B) is in a parallelpiped, and the terminal (19) is held in position between the projections with frictional force. In the case of the embodiment shown in FIG. 4(b), the projection (17C) is in a round-headed shape with its distal end portions being collapsed by an external force.

Upon completion of the delay medium and the terminal being connected each other and housed in the casing, the cover is placed on the open end of the casing as shown in FIG. 3(b), and the circumference between the casing and the cover is bonded together by means of, for example, ultrasonic welder to be tightly sealed, thereby finishing up the package structure.

This type of the ultrasonic delay line is extremely easy in its connection with the lead wire (3), because the base part of the planar metal terminal is fixed at its both ends with the projections.

In the next place, explanations of the second embodiment will be made in reference to FIGS. 5(a), 5(b) and FIGS. 6(a), 6(b).

In FIGS. 5(a) and 5(b) which illustrate the casing (11) and the cover (21) for use in the present invention, the casing (11) is constructed with the bottom plate (12), the outer frame (13) encompassing this bottom plate, the delay medium accommodating section (14) having a large area and provided on the upper part of the casing (11), the terminal accommodating section (15B) having a small area and provided at the lower part of the casing in a downwardly notched form, and the partitioning frame (16) which separates both accommodating sections individually. A plurality of projections (17D) (four, in this embodiment) are provided in each of the terminal accommodating sections (15B) in the recessed form.

As shown in FIGS. 6(a) and 6(b), the delay medium (1) is housed in the delay medium accommodating section (14), and the planar metal terminals (19) of thin thickness are housed in the terminal accommodating section (15B). As illustrated in FIG. 7(a), the base part (20) of the planar metal terminal (19) has a large width, at the center part of which there is perforated a hole (22). The hole (22) in this base part (20) is fitted with the projection of the terminal accommodating section to be tightly fixed by frictional force between the center hole and the projection. In case further strength is required, the distal end part of the projection is pressed by the ultrasonic welder, etc. to be collapsed so that the same may be in a tight contact with the hole (22) in the base part (20). To this base part (20) of the planar metal terminal (19), there is connected, by welding or soldering or others, one end of the lead wire (3), the other end of which has been connected with the transducer (2) by soldering or with an electrically conductive adhesive agent.

Same as in the first embodiment, this second embodiment is also extremely thin in its overall construction, as shown in FIG. 6(b), and any foreign substance such as flux, etc. is difficult to intrude thereinto from outside, and the planar metal terminal (19) can be readily fitted with the help of the projections (17D) in the terminal accommodating section (15B), followed by rigid fixing of the same.

FIGS. 7(a) and 7(b) illustrate different embodiments of the projection to be provided in the terminal accommodating section of the present invention.

In the case of FIG. 7(a), the projection (17E) is in a parallelepiped form and the terminal (19) is held by frictional force. In the case of FIG. 7(b), the projection (17F) is collapsed at its distal end to be round-headed.

Upon completion of the delay medium and the terminal being connected each other and housed in the casing, the cover (21) is placed on the open end of the casing, as shown in FIG. 6(b), and bonded around its circumference at its meeting portion with the casing by means of, for example, the ultrasonic welder to be tightly closed, thereby finishing up the package structure.

This type of the ultrasonic delay line is advantageously capable of fixing a single terminal with a single projection, because the hole in the planar metal terminal is fitted with the projection in the terminal accommodating section, and fixedly securing in it. It is also capable of arranging a plurality of terminals at any arbitrary positions, which is another advantage.

Various modifications and changes are possible in the present invention, not being limited to the afore-described two embodiments. For example, two delay medium may be accommodated in the casing. It may be preferred that the construction of the casing and the cover be modified in various ways, such that, as one example, of the outer frame (13) shown in FIG. 2, the upper frame alone is removed from the side of the casing, and, instead, it is formed on the upper part of the cover (21) as the outer frame so that a tightly closed construction may be obtained when the casing and the cover are fitted together. However, a combination of the box-shaped casing and the planar cover, as shown in the afore-described embodiments, is one which is the simplest in shape, is most readily manufacturable, and is easy for handling. Therefore, such form of the casing and the cover is most preferable. Furthermore, besides these two embodiments, it may be feasible to accommodate circuit component parts in the terminal accommodating section, and to effect various other applications.

As stated in the foregoing, since the present invention has adopted a construction such that the base plate and the casing are integrally formed, and the planar metal terminal is adopted to avoid any superposition between the delay medium and the terminals within the casing, the delay line can be made sufficiently thin in its thickness and small in its overall size. In addition, since the terminal accommodating section and the delay medium accommodating section are separated by the partition frame, the device can prevent intrusion thereinto of any foreign substance such as flux, etc. from outside, which is excellent in comparison with the conventional ultrasonic delay line.

Although the present invention has been described specifically with reference to a couple of preferred embodiments thereof, it should be understood that the invention is not limited to these embodiments alone, but any changes and modifications may be made by those skilled in the art within the spirit and scope of the present invention as recited in the appended claims.

We claim:

1. An ultrasonic delay line comprising: a casing having therein a delay medium accommodating section to accommodate therein a delay medium and a terminal accommodating section to accommodate therein planar metal terminals; and a cover to tightly close said casing, wherein said terminal accommodating section has a plurality of projections to fix the planar metal terminals, a partition frame is provided between said terminal accommodating section and said delay medium accommodating section to separate said both accommodating sections, the delay medium is accommodated in said delay medium accommodating section, the base part of said planar metal terminal is positioned and housed by means of projections in said terminal accommodating section, and one end of a lead wire, the other end of which has been connected with a transducer provided on the side surface of the delay medium, is connected with the base part of said planar metal terminals.

2. The ultrasonic delay line according to claim 1, wherein the delay medium is accommodated in said delay medium accommodating section defined in the casing (11) comprising a bottom plate (12), an outer frame (13) surrounding the bottom plate, the delay medium accommodating section (14) to accommodate therein the delay medium (1), the terminal accommodating section (15), to accommodate therein planar metal terminals (19), a plurality of projections (17) to fix the planar metal terminal provided in the terminal accommodating section, and a partition frame (16) to separate the delay medium accommodating section and the terminal accommodating section; and wherein said projections are fitted with a hole (22) perforated in the base part (20) of the planar metal terminal and fixed, followed by accommodating the same in the terminal accommodating section, then one end of a lead wire (3), the other end of which has been connected with a transducer (2) provided on the side surface of the delay medium, is connected with the base part of said planar metal terminal, and the casing is tightly closed with a cover (21).

3. The ultrasonic delay line according to claim 1, wherein the casing comprises:
a bottom plate, an outer frame surrounding said bottom plate, and wherein, the terminal accommodating section is adapted to accommodate therein planar metal terminals, a plurality of projections provided in said terminal accommodating section and means to fix said planar metal terminals and a partition frame to separate said delay medium accommodating section and said terminal accommodating section; and wherein the base part of the planar metal terminal is pushed in and fixed at a space between said adjacent projections, wherein the same is accommodated in said terminal accomodating section, with one end of a lead wire, the other end of which has been connected with a transducer provided on the side surface of said delay medium, connected with the base part of said planar metal terminal, and wherein the casing is tightly closed with a cover.

4. The ultrasonic delay line according to claim 3, wherein the distal end of said projection is collapsed after the base part of said planar metal terminal is pushed in the space between said adjacent projections.

5. The ultrasonic delay line according to claim 1, wherein said delay medium accommodating section defined in the casing comprises:
a bottom plate,
an outer frame surrounding the bottom plate,
the delay medium accommodating section to accommodate therein the delay medium, and wherein the terminal accommodating section comprises means to accommodate therein, planar metal terminals, a plurality of projections to fix the planar metal terminal provided in the terminal accommodating section, and a partition frame to separate the delay medium accommodating section and the terminal accommodating section; and wherein said projections are fitted with a hole perforated in the base part of the planar metal terminal and fixed, followed by accommodating the same in the terminal accommodating section, having one end of a lead wire, the other end of which has been connected with a transducer provided on the side surface of the delay medium, connected with the base part of said planar metal terminal, and having the casing tightly closed with a cover.

6. The ultrasonic delay line according to claim 5, wherein the distal end of said projection is collapsed after it is fitted with the hole of the base part of the planar metal terminal.

* * * * *